(12) United States Patent
Choi et al.

(10) Patent No.: US 10,448,518 B2
(45) Date of Patent: Oct. 15, 2019

(54) METHOD FOR MANUFACTURING A CIRCUIT HAVING A LAMINATION LAYER USING LASER DIRECT STRUCTURING PROCESS

(71) Applicant: ETHERTRONICS, INC., San Diego, CA (US)

(72) Inventors: Seung Hyuk Choi, Gyeonggi-do (KR); Hyun Jun Hong, Gyeonggi-do (KR); Tae Wook Kim, Gyeonggi-do (KR); Cheong Ho Ryu, Gyeonggi-do (KR); Young Sang Kim, Gyeonggi-do (KR); Sung Jun Kim, Gyeonggi-do (KR)

(73) Assignee: Ethertronics, Inc., San Diego, CA (US)

( * ) Notice: Subject to any disclaimer, the term of this patent is extended or adjusted under 35 U.S.C. 154(b) by 254 days.

(21) Appl. No.: 15/170,943

(22) Filed: Jun. 2, 2016

(65) Prior Publication Data
US 2017/0094801 A1    Mar. 30, 2017

(30) Foreign Application Priority Data
Jun. 2, 2015    (KR) ........................ 10-2015-0078172

(51) Int. Cl.
*H05K 3/46* (2006.01)
*H05K 3/18* (2006.01)
(Continued)

(52) U.S. Cl.
CPC ......... *H05K 3/4644* (2013.01); *H05K 3/0014* (2013.01); *H05K 3/0026* (2013.01); *H05K 3/185* (2013.01); *H05K 3/188* (2013.01); *H05K 3/28* (2013.01); *H05K 3/423* (2013.01); *H05K 3/4652* (2013.01); *H05K 2201/09118* (2013.01); *H05K 2201/09827* (2013.01); *H05K 2201/09854* (2013.01); *H05K 2203/0582* (2013.01);
(Continued)

(58) Field of Classification Search
CPC .... H05K 3/0014; H05K 3/0026; H05K 3/185; H05K 3/188; H05K 3/28; H05K 3/423; H05K 3/4644; H05K 3/4652; H05K 2201/09118; H05K 2201/09827; H05K 2201/09854; H05K 2203/0582; H05K 2203/0588; H05K 2203/072; H05K 2203/107; Y10T 29/49124; Y10T 29/49155; Y10T 29/49165
See application file for complete search history.

(56) References Cited

U.S. PATENT DOCUMENTS

| 4,849,363 | A |  | 7/1989 | Coffey et al. |
| 6,207,259 | B1 | * | 3/2001 | Iino ...................... H05K 3/4652 174/250 |

(Continued)

FOREIGN PATENT DOCUMENTS

JP        2010205836 A  *  9/2010

*Primary Examiner* — A. Dexter Tugbang
(74) *Attorney, Agent, or Firm* — Dority & Manning, P.A.

(57) ABSTRACT

The present subject matter relates to the method of manufacturing circuit having lamination layer using LDS (Laser Direct Structuring) to ease the application on surface structure for applied product of various electronic circuit and particularly, in which can form circuit structure of single-layer to multiple-layer on the surface of injection-molded substrate in the shape of plane or curved surface, metal product, glasses, ceramic, rubber or other material.

13 Claims, 7 Drawing Sheets

(51) Int. Cl.
*H05K 3/00* (2006.01)
*H05K 3/28* (2006.01)
*H05K 3/42* (2006.01)

(52) U.S. Cl.
CPC ............... *H05K 2203/0588* (2013.01); *H05K 2203/072* (2013.01); *H05K 2203/107* (2013.01); *Y10T 29/49124* (2015.01); *Y10T 29/49155* (2015.01); *Y10T 29/49165* (2015.01)

(56) References Cited

U.S. PATENT DOCUMENTS

| | | | |
|---|---|---|---|
| 6,930,257 B1 | 8/2005 | Hiner et al. | |
| 8,143,529 B2 | 3/2012 | Harada et al. | |
| 8,826,531 B1 | 9/2014 | Hiner et al. | |
| 2005/0202261 A1* | 9/2005 | Takai ................... | H05K 3/28 |
| | | | 428/458 |
| 2006/0225917 A1* | 10/2006 | Hu ........................ | H05K 3/28 |
| | | | 174/257 |
| 2008/0107863 A1* | 5/2008 | Ikeda .................. | H01L 21/4652 |
| | | | 428/137 |
| 2009/0002973 A1* | 1/2009 | Watanabe ............ | H05K 3/0014 |
| | | | 361/820 |
| 2012/0055708 A1* | 3/2012 | Kohda .............. | Y10T 29/49165 |
| | | | 174/264 |
| 2014/0041904 A1* | 2/2014 | Pedder ................. | H05K 3/4644 |
| | | | 174/251 |

* cited by examiner

METHOD FOR MANUFACTURING A CIRCUIT HAVING A LAMINATION LAYER USING LASER DIRECT STRUCTURING PROCESS

CROSS-REFERENCE TO RELATED APPLICATION

The present application claims priority of Korean Patent Application Number 10-2015-0078172, filed Jun. 2, 2015, the entire contents of which are hereby incorporated by reference.

BACKGROUND OF THE INVENTION

Field of the Invention

The present disclosure relates to the method of manufacturing circuit having lamination layer using LDS (Laser Direct Structuring), and more particularly, in which can form circuit structure of single-layer to multiple-layer on the surface of injection-molded piece in the shape of plane or curved surface, metal product, glasses, ceramic, rubber or other material.

Description of the Related Art

In general, Printed Circuit Board (PCB) or f (FLEXIBLE)—the PCB is used for the circuit implementation for electronic device. In the related art, copper-clad circuit is patterned on an epoxy double-sided resin such as a FR-4, and multiple-layer structure is manufactured by adding copper-clad circuit patternization after the formation of insulator for multiple-layer structure.

However, in the related art such as PCB or F-PCB, circuit having multiple-layer structure cannot be laminated during formation of 3-dimensional free curved-surface due to the difficulty of copper foil's adhesion and uniformity of patterning.

Thus, an antenna, a speaker or the like is manufactured as an example primarily to form single-layer wiring by using LDS method previously. However, suggestion for the method to laminate a circuit having multiple-layer in 3-dimensional free curved surface shape is proposed.

SUMMARY OF THE INVENTION

Problems to be Solved

Thus, various aspects of present invention are directed to providing solutions for aforementioned issues. An intent to this invention is to be easily applied to curved surface shape of applied product in various magnetic circuit by using the method for manufacturing circuit having lamination layer using process on the planar or curved surface shape of the injection-molding metal product, glass, ceramic, rubber or other material on top of formation from circuit having single-layer structure to circuit having multiple-layer structure.

Proposed Solutions

First, to summarize the feature of present disclosure, method for manufacturing circuit having Lamination Layer using LDS process to achieve the purpose of aforementioned present invention according to an exemplary embodiment of the present disclosure may include: a laser direct structuring method for the multiple-layer circuit using injection-molding, LDS of the material of the substrate or other material on a substrate coated with a paint using LDS substrate, each laser irradiation, layer forming a circuit pattern, the plating of the circuit pattern, and a step of coating the paint for LDS formed by repetition of a multiple-layer circuit; electronic device for the coupling of the top of the multiple-layer circuit included in the circuit pad; and an inter-layer circuit of the multiple-layer circuit to make electrical contact, paint coating of the masked region during, or LDS portion formed through the paint before application of the paint of the previous layer the delaminated region which is formed through a portion of the LDS Aforementioned circuit having Lamination Layer using LDS process may further include the following surface; the preformed holes in the draft angle on the surface of the substrate for the electrical contact between the circuit in the space between upper and the back surface of the substrate, and the holes LDS part that caused by plated overlay during the plating process that happens after masking the hole during the application of the coating.

Aforementioned circuit having Lamination Layer using LDS process may further include the following surface; the formed circuit on the side surface of the substrate for the electrical contact between the circuit in the space between upper and the back surface of the substrate, and the sides LDS part that caused by plated overlay during the plating process that happens after masking the hole during the application of the coating.

Substrate of other materials may include any substrate of metal, glass, ceramic or rubber.

Paint delamination may be formed by using laser, perforator, awl, knife, alcohol, or chemical substances.

The minimum radius of the rear side of the hole can be measured by the following formula;

R=No. of overlapping laminates the thickness of each plated layer 150%.

In addition, according to another aspect of the invention LDS (Laser Direct Structuring) construction method, a method for manufacturing a multiple-layer circuit using LDS injection-molding of the material for the substrate or of the other material on a substrate coated with a paint for LDS to the substrate, each by laser irradiation, each layer forming a circuit pattern, the plating of the circuit pattern, and LDS by repeating the step of coating the paint for forming a multiple-layer circuit comprising the steps of forming the multiple-layer circuit for coupling to the electronic device the uppermost circuit of the multiple-layer circuit a step of forming a pad, and the inter-layer circuit of the multiple-layer circuit to make electrical contact, through the masked region during a paint coating to form a portion of the LDS, or a paint prior to application of the paint of the previous layer through the delaminated region that forms part of the LDS Aforementioned method for manufacturing circuit having Lamination Layer using LDS process may further include the following step; formation of the preformed holes in the draft angle on the surface of the substrate for the electrical contact between the circuit in the space between upper and the back surface of the substrate, and the formation of the holes LDS part that caused by plated overlay during the plating process that happens after masking the hole during the application of the coating.

Aforementioned method for manufacturing circuit having Lamination Layer using LDS process may further include the following step; formation of the formed circuit on the side surface of the substrate for the electrical contact between the circuit in the space between upper and the back surface of the substrate, and the formation of the sides LDS part that caused by plated overlay during the plating process that happens after masking the hole during the application of the coating.

Effects of the Invention

According to (an exemplary embodiment of) the present disclosure, a method for manufacturing circuit having lamination layer using LDS process ease the manufacturing process of 3-dimensional free curved-surface which could not be implemented with PCB or F-PCB substrate previously by providing a method in which can form circuit structure of single-layer to multiple-layer on surface of injection-molded piece in the shape of plane or curved surface, metal product, glasses, ceramic, rubber or other materials In addition, according to (an exemplary embodiment of the) present disclosure, a method for manufacturing circuit having lamination layer using LDS process ease the application of electronic circuit board such as MRI coil, touch censor circuit, LED module, antenna, speaker and other electronic devices in need of circuit having lamination layer on the surface of plain, curved or surface connected in between plain and the curve.

In addition, according to (an exemplary embodiment of the) present disclosure, circuit board (substrate) having lamination layer using LDS process enables soldering or SMT (Surface Mount) of electronic device such as capacitor, inductor, resistor by using heat resistance, metal and such materials.

In addition, according to (an exemplary embodiment of the) present disclosure, a method for manufacturing circuit having lamination layer using LDS process enables the electrical contact in between the circuit pattern of the top and back of the substrate by using sides LDS or substrate formed holes that are made up of injection-molding, metal material, glass, ceramic, rubber and such materials or sides LDS. Alternatively, delamination method can also be applied using masking during paint layer or using laser to create electrical contact in between each layer of circuit pattern.

DETAILED DESCRIPTION OF THE PREFERRED EMBODIMENTS

Figure 1A:
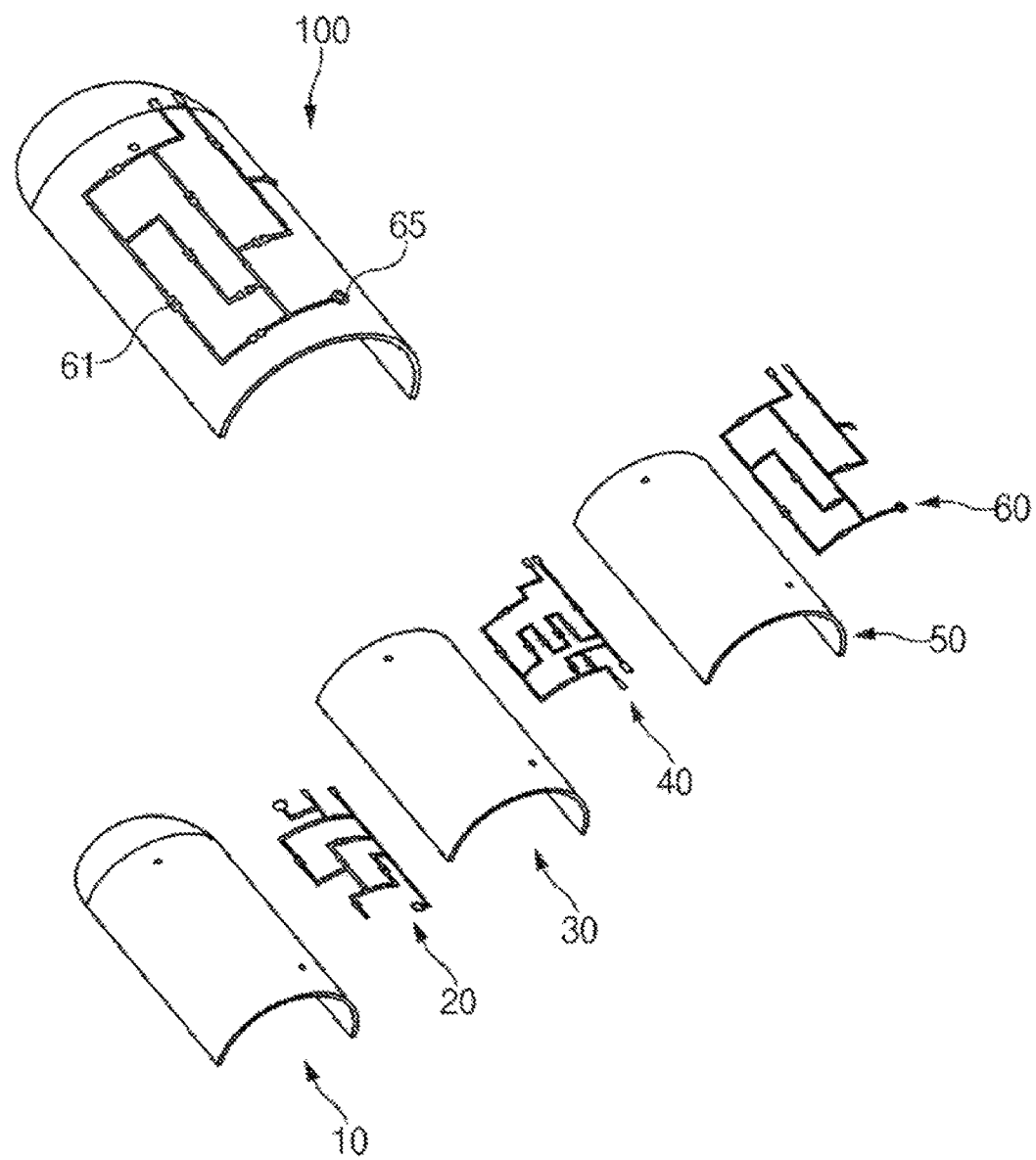
FIG. 1A is a drawing illustrating an exemplary embodiment of the present disclosure of circuit having lamination layer and its production methods in accordance with an illustrated example.
Figure 1B:
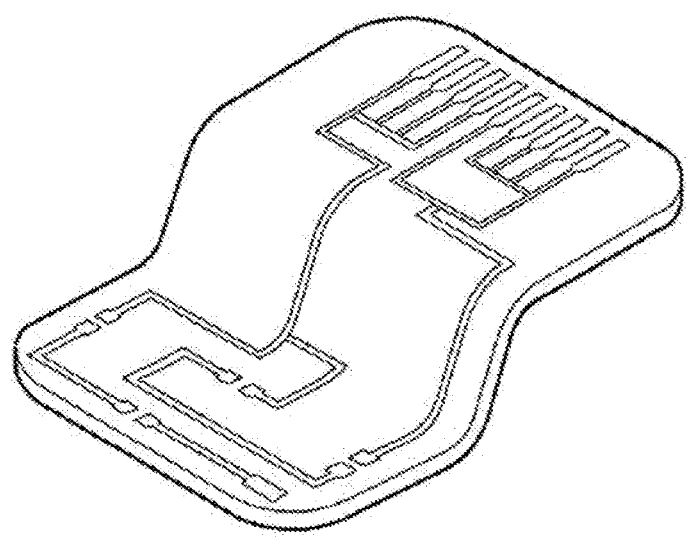
FIG. 1B is an example drawing of circuit board having lamination layer in accordance with another example.

The invention is illustrated in the accompanying drawings, throughout which like reference letters indicate corresponding which like reference letters indicate corresponding parts in the various figured. Hereinafter, an exemplary embodiment of the present invention will be described in detail with reference to the accompanying drawing. In this case, each figure represent similar available code for similar components. In addition, detail descriptions for previously mentioned function and/or construction/composition will be omitted. Below mentioned description focus on necessary explanation to help understand various preferred embodiments and will be omitted if unclear. In addition, the part of the drawing or partial components may be exaggerated, omitted or summarized. The size of the drawings may not represent actual size of the components. Size of each component is not entirely reflected of actual size, therefore is not restricted or limited relatively by the size or the interval of the components.

Referring to FIG. 1a is a drawing to illustrate present disclosure of laminated circuit structure and its manufacturing method. Drawing 1a illustrates curved-surface produced laminated circuit, and drawing 1b illustrates produced laminated circuit connected to flat/plane and curved surface. In this way, present disclosure is easily applied/adapted to manufacturing process of electronic circuit board/substrate, such as MRI (Magnetic Resonance Imaging), coil, touch sensor, circuit, LED (Light Emitting Diode), module, antenna, speaker, and other electronic devices According to the drawing 1a, the present invention relates to a multiple-layer circuit substrate (or structure) (100) is for LDS of the material of the substrate 10 or injection-molded article, metal, glass, a ceramic, a rubber other material of the substrate coated with a paint for LDS to the substrate (11), using a circuit pattern by laser irradiation, each layer is formed multiple layer circuit structure each forming a plating of the circuit pattern, and LDS by repeating the step of paint coating formulation of a multi-layer circuit is formed in a structure, and may include a capacitor, an inductor, a resistance etc. electronic device soldering or SMT (Surface Mount) for a pad (61) on top of uppermost surface of the circuit.

In addition, the present disclosure, multiple-layer circuit substrate 100, may include the LDS portion (65) LDS portion or a side surface of the (see FIG. 5 66) for the upper and the back surface of the circuit for electrical contact, and comprise an interlayer circuit for the electrical contact through the masked region during the application of paints LDS portion/area (70 of FIG. 6.) or laser, and the like, formed using a paint delamination through the area of the LDS portion (FIGS. 7 to 80.), and the like. The portion of the LDS the laser irradiation means the metallized portions through the plating.

FIG. 1A, For the production of the present disclosure of laminated circuit board/substrate (100), First, substrate board (10) using LDS, metal, glass, ceramic, rubber or other material of the paint coating substrate (11) using LDS may be prepared. Injection molding substrate (10) using LDS may be dielectric resin substances (for example, PC resin, PC/ABS) including metal seed exposed/discovered by laser investigation. In addition, Paints using LDS is dielectric coating material composed of metal seed mixture exposed/discovered by laser investigation.

As such, when the manufacturing of the laminated circuit board (100) is prepared for the substrate (10/11), computer (for example, desktop PC, notebook PC ect.) can form a first layer circuit pattern (20) by exposing applied area of meta seed by investigation on substrate (10/11) by removing laser investigation equipment through applicants and programs, plating of first layer circuit pattern (20) formation section/area exposed by metal seed using electroplating or chemical plating. Line width or line spacing using such LDS may be processed as detail as within 0.1 mm.

Next, Paint (30) is coated using the same LDS used above on the substrate in which first layer circuit was formed. After, a second layer of the circuit pattern (40) is formed through laser investigation using the same technique above, and second layer through circuit is formed through the plating of second layer circuit pattern (40), Paint coating (50) using LDS from above on a formed substrate of second layer circuit, and then, third layer circuit patter (60) is formed through the laser investigation by using same technique from above, and the third layer circuit is formed through the plating of third layer circuit pattern (40)

In such a manner, lamination layer structure formed multiple layer circuit after repeated paint coating process using LDS, plating of each layered circuit pattern, and each layer's circuit pattern formation through laser investigation. In addition, on the uppermost part of circuit may be included capacitor, inductor, and resistor of Pad (61) for soldering or SMT (Surface Mount) for electronic device.

Here, manufacturing process of laminated circuit is explained through the formation of circuit pattern in front section of substrate (10/11), same can be manufactured in the back section of substrate (10/11) in the same manner of how front section of substrate produce circuit pattern to manufacture laminated circuit structure.

In addition, to prevent from peeling and poor contact from each circuit layer, it is advisable to paint coating minimum 25 μm (for example, below 1000 μm) for each layer circuit pattern formation. After the paint coating during laser investigation depending on the strength or the time exposure, coating may become thin or peeling, and circuit layer contact may occur due to the peel which may cause critical defect. For example, it is advisable to apply the thickness of coating in between 25 μm and 50 μm when it apply to electronic device like cell phone which is sensitive to the thickness of the coating.

Figure 2:
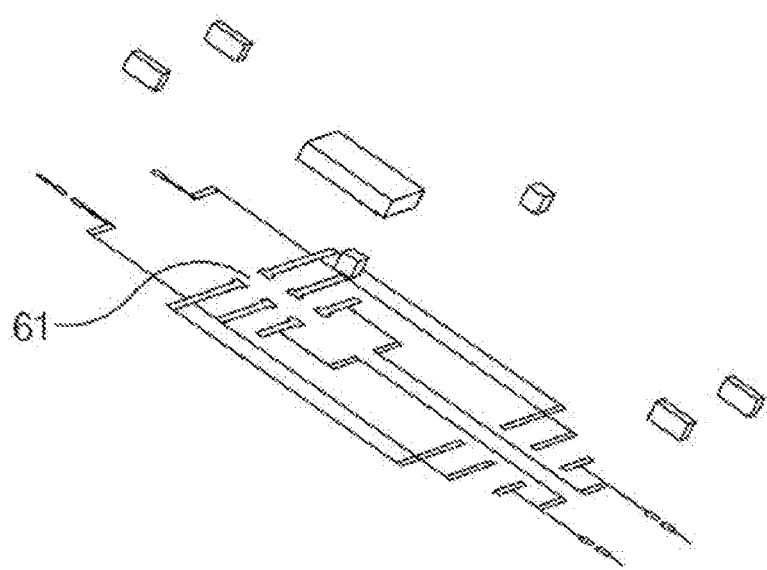
FIG. 2 is a drawing illustrating an exemplary embodiment of the present disclosure of Soldering or SMT of electric devices on circuit board (substrate) having lamination layer.

FIG. 2 is a drawing illustrating soldering or SMT for electronic device on laminated circuit board/substrate according to according to the present disclosure.

The laminated circuit board (100) in the production of as described above, the uppermost circuit may depict electronic device soldering or SMT (Surface Mount) for the pad (61), a capacitor, an inductor, a resistance or ect on pad (61) may be combined through electronic device's manual soldering pin or an automatic soldering (SMT)

For heat resistance, metal, glass, ceramic, and other high heat resistance material of the substrate using LDS coating substrate (11) can be used as well as high resistance resin using for LDS injection molding material of the substrate (10). High heat resistant resin combined synthetic resin which does not alter the form under high temperature. For example, soldering on top of applied circuit is possible if manufacturing LDS circuit using injection molding after the injection using high heat resistant PC resin using LDS of SABIC. In addition, paint coating for each circuit can be manufacture using high heat resistance paint. For example, by paint coating with high heat resistance paint using LDS, soldering is possible on top of the applied circuit.

Figure 3:
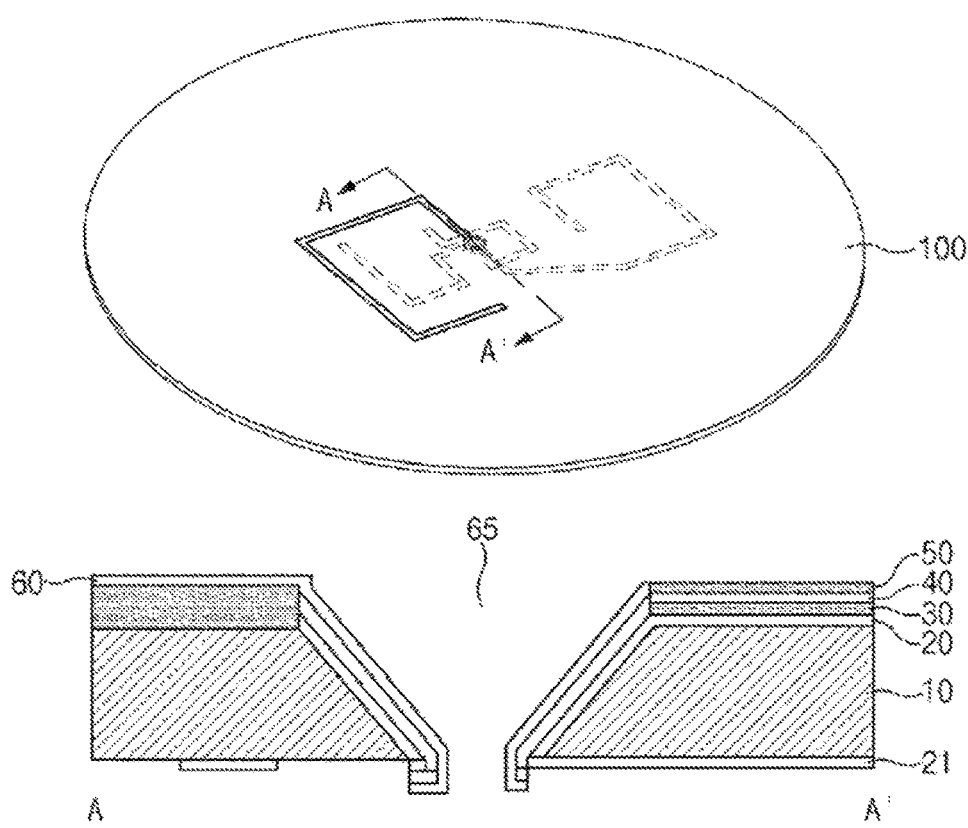
FIG. 3 is a drawing illustrating an exemplary embodiment of the present disclosure of an example of electrical contact method in between top and back surface of the circuit within the circuit board having lamination layer in accordance with the illustrated example.

FIG. 3 is a drawing for illustrating an example of the method for the upper and the back (surface of circuit/side of a diagram) electrical connection included on laminated circuit substrate (100) according to the embodiment of present disclosure, for illustrating an example. Wherein each layer of FIG. 4, the examples of the circuit may be referenced.

The present disclosure of multiple-layer circuit board (100) includes formed on the top of the at least one layer of a circuit, and the hole LDS part/section (65) for electrical contacts on the back surface of the at least one layer of a circuit.

For the upper surface of the circuit (20, 40, 60) and a backside circuit (21. ect) of the electrical contact to the continuity, for example, as shown in FIG. 3, the holes LDS portion (65) injection mold for the formation of the back surface in the substrate (10), previous draft angle (15 degrees~30 degrees wider towards the center) is forming widening hole, and is formed of each layer circuit.

Figure 4:
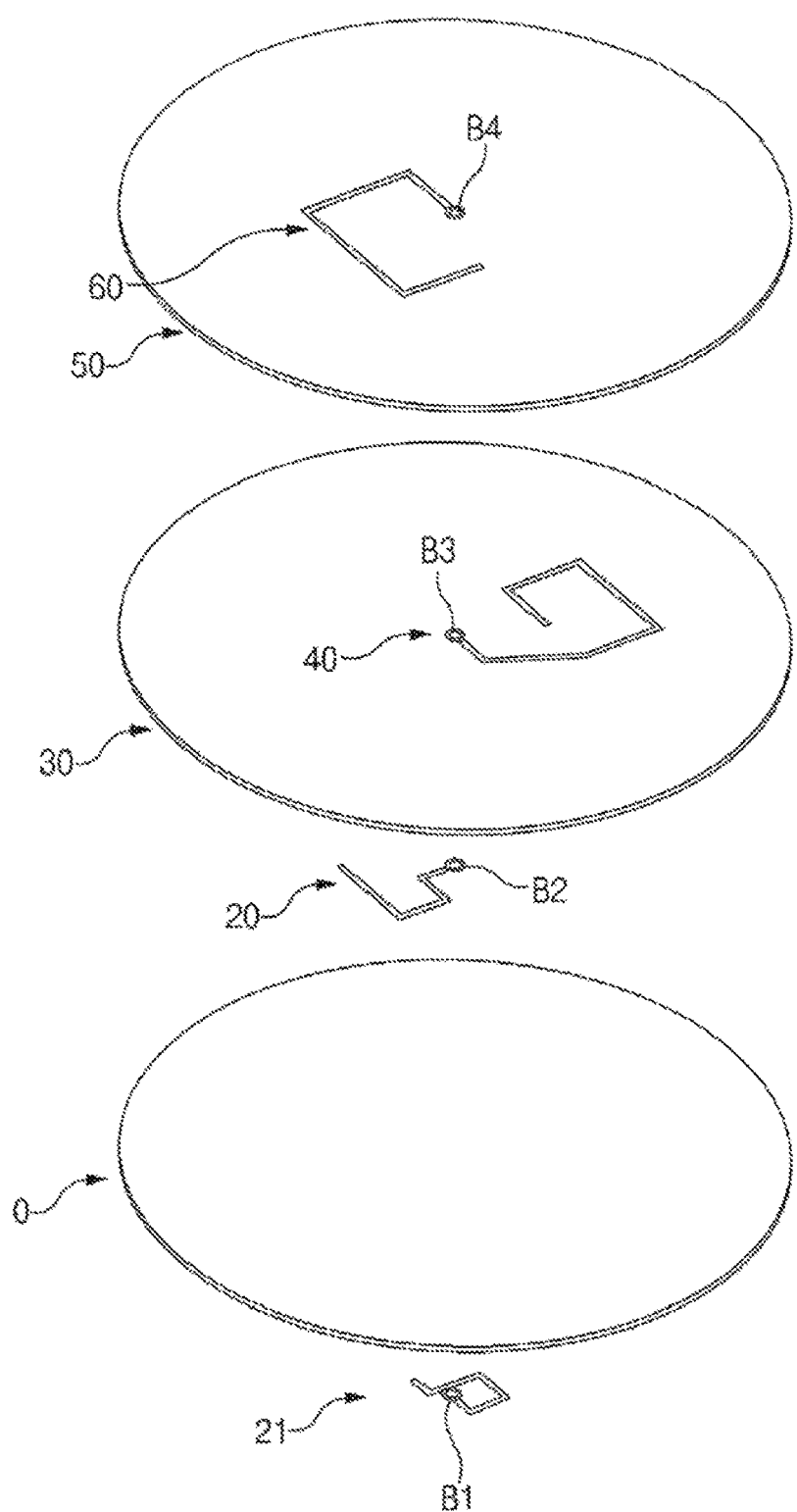
FIG. 4 is a drawing in concrete details of each layer of the circuit by the electric contact method.

In other words, first, after such as injection molding substrate (10) having a hole back side of to the circuit pattern (21) forming and plating the circuit in the back (including front section of circuit around the hole in the back, and back side of the circuit for continuity) as well as first layer circuit implementation through laser investigation and plating using LDS inside of the hole and the back side of the circuit(s) during the front first layer circuit implementation through the formation and plating the back side circuit, second paint (30) coating can be applied after masking using small amount of mask avoiding the paint coating around the aforementioned like hole area. After second paint (30) coating, masking can be removed, and second layer circuit using LDS is implemented through laser investigation and plating process. At this point, aforementioned hole is not paint coated, but due to the plated part together with first layer circuit (20, 21), thus plating may be continued due to the superimposed over the plating so as to overlap. In the same way as the second layer was implemented, third layer each circuit, each inward into the hole by implementing the plating holes formed to overlapping LDS portion (65) is formed through the hole, all layers of the conducting circuit can be implemented. Thus, for example, as shown in FIG. 4, LDS portion (65) holes enables continuity electrically in between each layer circuit corresponding portion (B2, B3, B4) on each layer formed on the top surface and the back side of formed circuit corresponding portion (B1). However, for a circuit of each layer of paint coating by applying at the time of the corresponding to the inner holes layer is insulated from the circuit may not be continued.

Meanwhile the aforementioned like hole may form widening hole through pre-draft angle (for example, with respect to the center line from 15 degrees~30 degrees) to prevent circuit and smooth laser operation from the disconnection, minimum size [equation 1] of the small hole of radius (R) can be determined.

$$R = \text{No. of overlapping laminates} * \text{the thickness of each plated layer} * 150\%$$

For example, scheduled process of overlapped laminated layer number is four, and if the thickness of the plating is 15

μm, Radius(R) may calculated to greater than 4*15 μm*150%=90 μm. However, considering production and yield, the radius (R) of the hole is preferable when greater than 200 μm.

Figure 5:
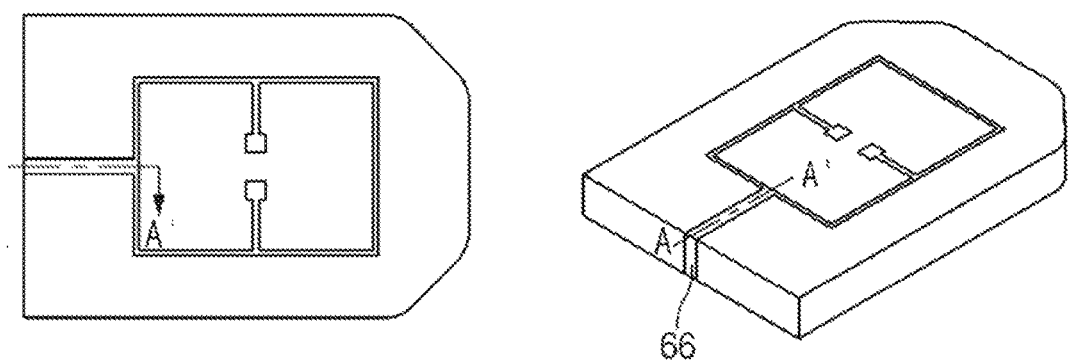
FIG. 5 is a drawing illustrating (an exemplary embodiment of the) present disclosure of different example of electrical contact method in between top and back surface of the circuit within the circuit board having lamination layer in accordance with tested(?)/implemented example.
Figure 5:
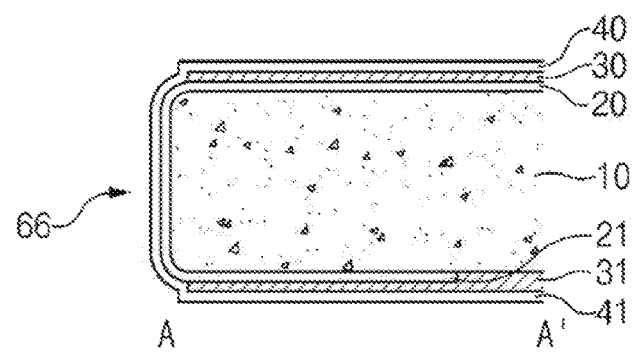
Figure 5:
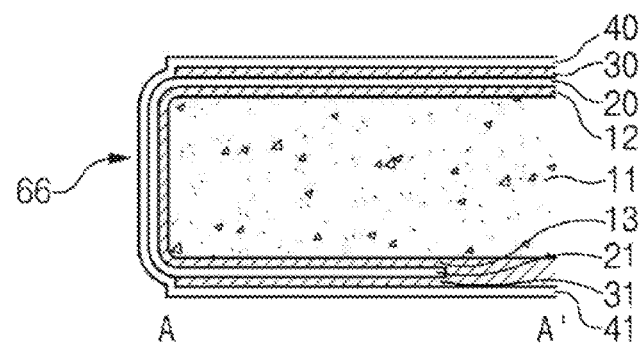

FIG. 5 is a drawing illustrating different example of electrical contact structure in between the top and back circuit including laminated circuit substrate/board (100) according to the embodiment of present disclosure. The upper portion of FIG. 5 (drawing 5) depict floor plan and isometric plan top view of laminated layer circuit substrate/board (100) for upper/top portion of the present disclosure, as well as the cross-sectional view of a portion A-A' below the upper/top portion of the present disclosure. A-A' portion of cross-sectional view is shown in the case of using the injection molding substrate/board using LDS substance or metal, glass, ceramic, rubber and related substance substrate using LDS paint (12/30) plated substrate (11).

As illustrated/described above, the front part/section of the substrate (10/11) by laser irradiation/investigation of each layer's circuit pattern (20, 40) formation, each layer circuit pattern plating, paint coating (12/30) using LDS may be used repeatedly to manufacture front section/portion of the substrate (10/11) of laminated circuit structure which can be included, and by using the same method, both the front and back section/portion of the substrate (10/11) is manufactured including back portion of the substrate (10/11) laminated layer circuit structure, repeatedly using each layer's circuit pattern (21, 41) formation, each layer circuit pattern plating, and the paint coating (13/31) using LDS.

Such as FIG. 5, the present disclosure of laminated circuit substrate (100) may include side LDS section/part (66) for electronic contact in between circuit including 1st layer or higher formed upper surface part of circuit and the back surface of 1st layer or higher formed upper surface.

Electrical contact of continuity for upper section of circuit (20, 40) and back side of the circuit (21, 41), for example, together with FIG. 5, for the formation of LDS section on the side substrate (10/11), front part of substrate (10/11), during the laser irradiation process and plating for the formation of first layer circuit pattern (20) and back side of first layer circuit pattern (21), circuit can be formed in the front and the back of electrical continuity between the circuit. During the process of paint (30/40) coating using LDS for font and back section of each layer circuit formation after second layer, paint is coated front and back after masking using small portion of masking by not paint coated on the side of LDS section (66). On the side section of side LDS section (66), paint is coated front and back after masking using the small portion of mask. After the Front and back side of each layer paint coating, mask is removed, and each layer circuit is implemented using LDS through laser irradiation and plating process. Even though side aforementioned LDS portion (66) of paint is not coated, overlapping upper portion may be continued through plating due to the plated part together with first layer circuit (20, 21). Front and back portion of all layer of continued circuit is implemented through the plating formation of the side LDS section (66). However, during the paint coating for each layer circuit, circuit after those layers can be disconnected so not be continued by coating the side LDS section (66).

Figure 6:
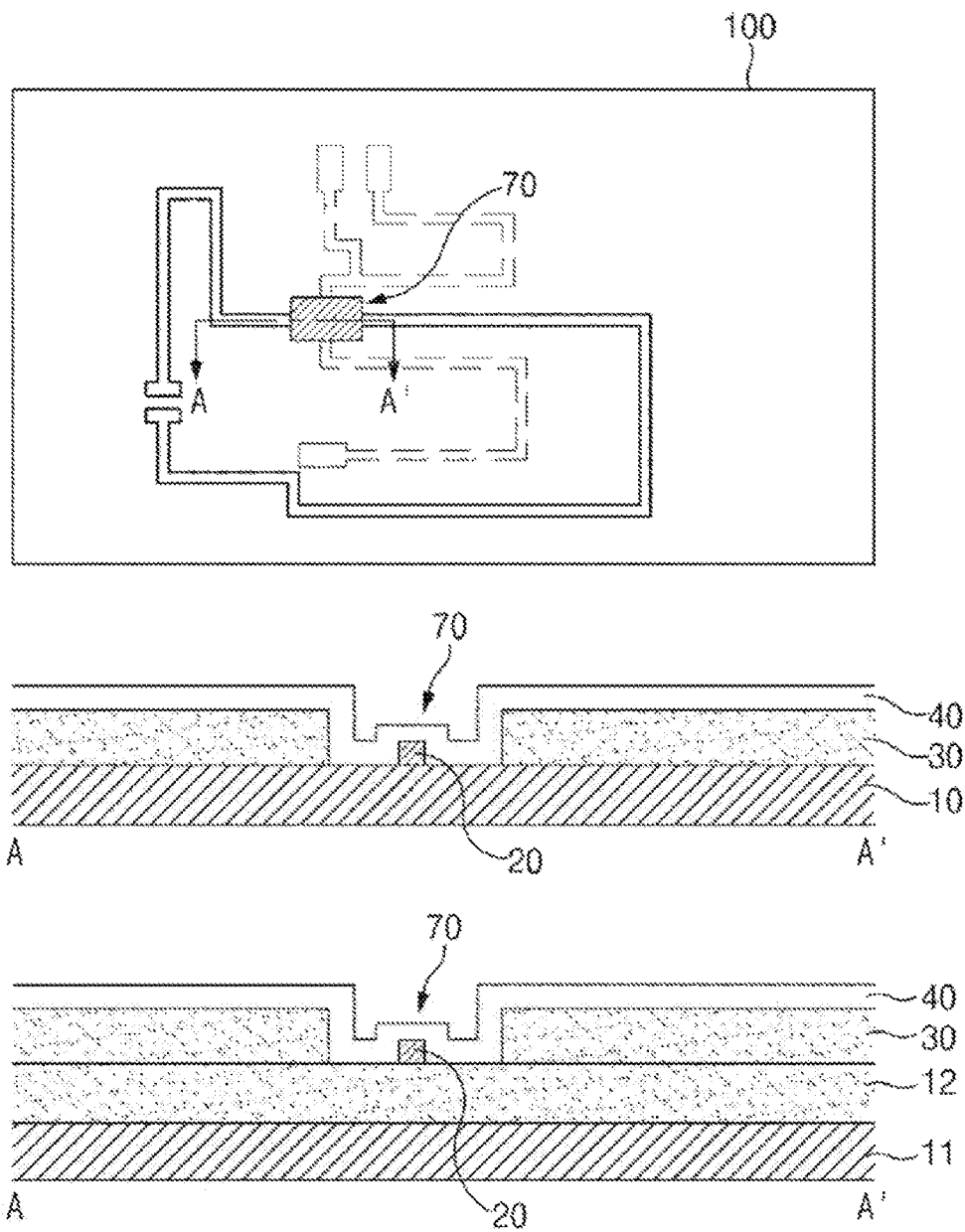
FIG. 6 a drawing illustrating (an exemplary embodiment of the) present disclosure of different another example (masking method for paint layer/coating) electrical contact method in each layers of the circuit within the circuit board having lamination layer in accordance with FIG. 7 a drawing illustrating (an exemplary embodiment of the) present disclosure of different another example (Method for Laser Delamination/Peeling) electrical contact method in each layers of the circuit within the circuit board having lamination layer in accordance with tested(?)/implemented example.

FIG. 6 is a drawing illustrating different example (paint coating masking method) of electrical contact in between circuit in between each layer including laminated layer circuit substrate/board (100) according to the embodiment of present disclosure. Upper portion of FIG. 6 illustrated plan view (floor plan) of the laminated layer circuit substrate/board (100), cross-section of A-A' portion is illustrated below. Cross-section of A-A' portion/section is described in case of using both injection molding substrate (10) using LDS, or metal, glass, ceramic, rubber and other related substances using LDS paint (12) coated substrate (11)

As, described above, the substrate (10/11) in each of the circuit pattern by laser irradiation (20, 40), each layer forming a circuit pattern plating, and paint coating (12/30) using LDS repeatedly may be manufactured through inclusion of laminated circuit structure on substrate (10/11)

Such as FIG. 6, the present invention of lamination circuit board/substrate (100) may include LDS part (70) connected to masking (ed) section during the paint coating for electrical contact of multiple-layer circuit.

For example, similar to via hole, for the portion of each layer circuit on both side of insulator for paint using LDS or circuit for every layer or paint coating for each layer using LDS paint, paint needs to be painted without paint coated around the masking area (for example, area greater than 1 mm2 of radius) by using small portion of masking during paint coating using LDS for each layer, and method to overlap plating for each layer can be used through laser irradiation and plating around applied section regarding corresponding area.

Figure 7:
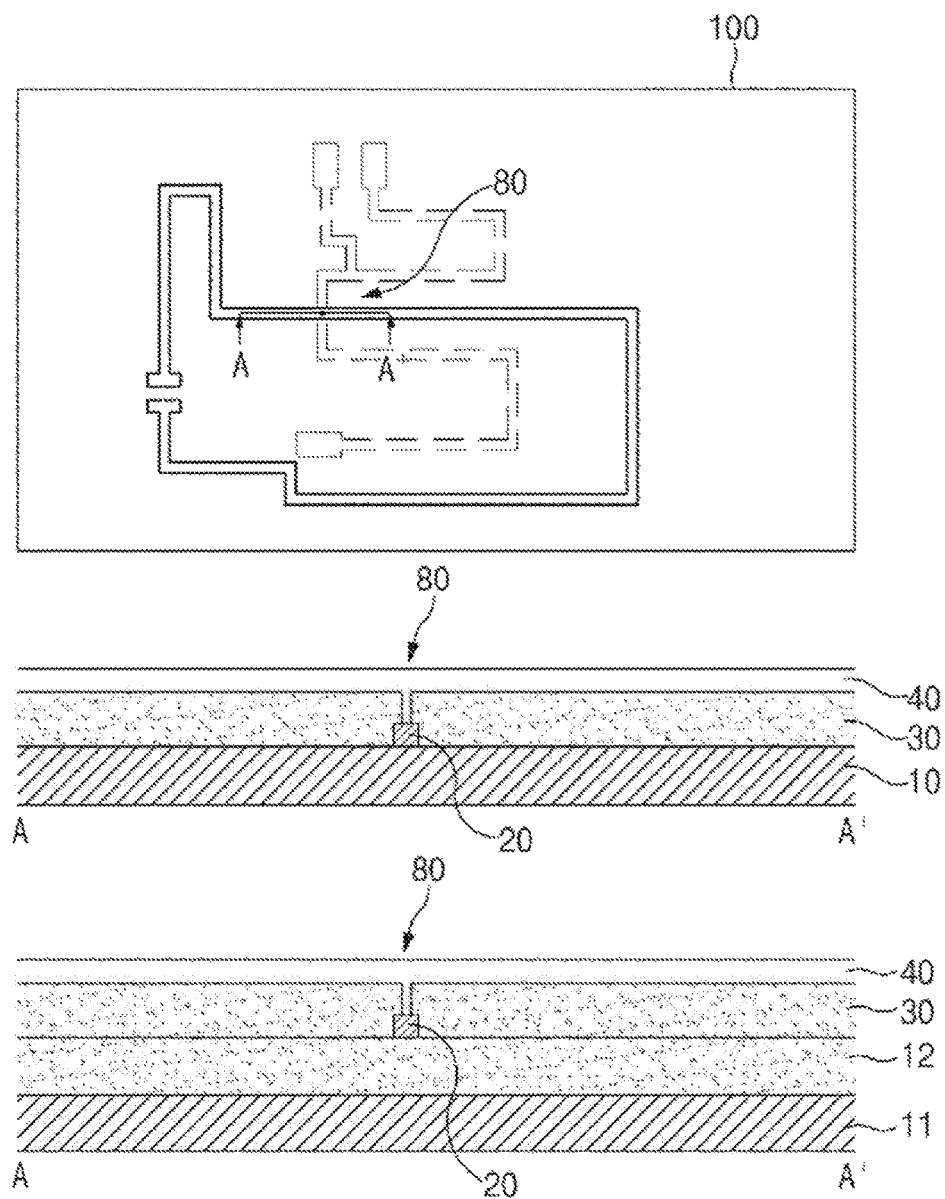

According to one embodiment of present disclosure, FIG. 7 is a drawing to illustrate another example (method for laser peeling) method of electrical contact in between each layer circuit including laminated circuit substrate/board (100). FIG. 7 illustrates floor plan for laminated circuit board/substrate (100) above, and cross-sectional view of A-A' section above. Portion of the cross-sectional view illustrates in the case for the injection molding substrate (10) using LDS substance, and paint (12) coated substrate (11) using LDS using metal, glass, ceramic, rubber and related material.

As described above, the substrate (10/11) using laminated layer circuit structure may be manufactured/fabricated including the substrate (10/11) in each of the circuit pattern (20, 40) through/by laser irradiation, each layer forming circuit pattern plating, and paint coating using LDS (12/30) repeatedly on the substrate (10/11)

As shown in FIG. 7, circuit board/substrate having lamination layer may include form LDS (8) part through paint delamination region by using laser, perforator, awl, knife, alcohol and chemical substances/drug for electrical contact in each layer circuit.

For example, for circuit continuity for each layer circuit for both side of insulator by LDS paints and all the layers, remove the paint from previous layer until the metal part of the circuit by using laser, percolator, awl, knife, alcohol and chemotherapeutic drug on the continued target area (for example, space diameter less than or equal to 1 mm) after the plating (circuit formation) of each layer circuit (for example first layer circuit) before paint coating next layer circuit (for example second layer circuit) using LDS paint coating. After, Each layer continuity can form during the process of laser investigation, plating, and its overlapping together with paint peeling area during laser investigation for targeted layer and targeted circuit pattern formation after paint coating using LDS for next layer circuit (for example 2nd layer circuit). In the implementation of the circuit in such a way enables the continuity of each layer, and continuity after selecting desired layer.

As described above, according to the present disclosure of the multiple-layer circuit board (100), by using LDS method and providing the method of single and multiple layer circuit formation on a flat, a curved surface shape injection molds, the metal product, glass, ceramic, rubber or other material.

In addition, a curved surface, a plane, or a curve connected to the planar surface or other various electric application required by laminated circuit can be easily applied for the manufacturing process of electrical circuit board/substrate such as an MRI coil, a touch sensor circuit, led module, an antenna, a loudspeaker, other electronic device electronic circuit board. By using high heat resistance injection-mold or metal for laminated circuit production using LDS of present disclosure, it also enables capacitor, inductor, resistance and alike of electric device soldering or SMT (surface mount). Also, by using injection mold, metal product, glass, ceramic and rubber material made substrate formed hole or side LDS for LDS laminated circuit production of present disclosure enables electrical contact in between upper and the back side of the circuit pattern of substrate, and delamination method using masking or laser during paint coating process for electric contact in between pattern layer can be used.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense, the invention being limited only by the provided claims.

DESCRIPTION OF THE CODE/SIGN

Injection-molding Substrate (10) for LDS material
Sealed Substrate (11) and Pad (61) for LDS Paints
LDS Part (70) connected to Masking Area during Paint Coating
DS Part (80) connected to Paint Delamination Area

What is claimed is:

1. A method for forming a multi-layer circuit structure, the method comprising:
   forming a first circuit pattern on a substrate using a laser;
   plating the first circuit pattern to form a first circuit on the substrate;
   after plating the first circuit pattern, masking a connection region of the first circuit to form a masking;
   after masking the connection region, applying a layer of paint over at least a portion of the first circuit;
   after applying the layer of paint, removing the masking such that the connection region is not coated with the layer of paint;
   forming a second circuit pattern on the layer of paint using the laser; and
   plating the second circuit pattern to form a second circuit on the layer of paint.

2. The method of claim 1, wherein the substrate comprises at least one curved surface and the first circuit is at least partially formed on the at least one curved surface.

3. The method of claim 1, wherein plating the second circuit pattern comprises electrically connecting the second circuit with the first circuit at the connection region.

4. The method of claim 1, wherein the first circuit pattern is formed on an upper surface of the substrate, and wherein the method further comprises forming a third circuit on a back surface of the substrate that is opposite the upper surface of the substrate.

5. The method of claim 4, further comprising:
   forming a through hole in the substrate; and
   electrically connecting the first circuit with the third circuit at a location that is proximate the through hole.

6. The method of claim 5, wherein a radius of the through hole is at least 1.5 times a total number of overlapping paint layers multiplied by a thickness of at least one of the first circuit or the second circuit.

7. The method of claim 5, wherein forming the through hole comprises providing an angled surface on the substrate such that a diameter of the through hole increases from the back surface of the substrate to the upper surface of the substrate.

8. The method of claim 7, wherein the angled surface of the substrate forms an angle with the upper surface of the substrate between 15 degrees and 30 degrees.

9. The method of claim 4, wherein the substrate comprises an edge surface extending from the upper surface to the back surface, and wherein the method further comprises electrically connecting the first circuit with the third circuit along the edge surface of the substrate.

10. The method of claim 1, wherein forming the second circuit pattern on the layer of paint using the laser comprises defining a pad area suitable for soldering a surface mount component to the second circuit.

11. The method of claim 1, wherein the substrate comprises at least one of metal, glass, ceramic, or rubber.

12. The method of claim 1, further comprising forming the substrate using injection molding.

13. The method of claim 1, wherein plating the first circuit pattern or plating the second circuit pattern comprises forming a layer of conductive material having a thickness ranging from 25 μm to 50 μm.

* * * * *